United States Patent [19]

Hight et al.

[11] 4,040,885
[45] Aug. 9, 1977

[54] ULTRASONIC BONDING APPARATUS

[75] Inventors: Michael John Hight, Redhill; Roy Victor Winkle, Crawley; John Robert Dale, Brighton, all of England

[73] Assignee: U.S. Philips Corporation, New York, N.Y.

[21] Appl. No.: 594,271

[22] Filed: July 9, 1975

[30] Foreign Application Priority Data

July 9, 1974   United Kingdom ............... 30383/74

[51] Int. Cl.² .............................................. B23K 1/06
[52] U.S. Cl. ..................................... 156/378; 73/67.1; 73/67.2; 73/71.4; 156/73.2; 156/380; 156/580; 228/1 B; 228/110; 310/314
[58] Field of Search ...................... 156/73.2, 378, 580, 156/367, 380; 228/1, 110; 73/67.7, 71.4, 67.1, 67.2; 310/8.1

[56] References Cited
U.S. PATENT DOCUMENTS

| 3,302,454 | 2/1967 | Kleesattel | 73/67.1 |
| 3,307,393 | 3/1967 | Kessler | 73/67.1 |
| 3,323,352 | 6/1967 | Branson | 73/67.1 |
| 3,489,241 | 1/1970 | Steinberg | 228/1 |
| 3,573,781 | 4/1971 | Shoh | 228/1 |
| 3,727,822 | 4/1973 | Umbaugh | 228/1 |
| 3,794,236 | 2/1974 | Salzer et al. | 73/67.2 |
| 3,827,619 | 8/1974 | Cusick et al. | 73/71.4 |
| 3,852,999 | 12/1974 | Wright | 73/67.1 |
| 3,857,279 | 12/1974 | Salzer | 73/67.2 |
| 3,863,827 | 2/1975 | Foulke et al. | 228/1 |
| 3,955,404 | 5/1976 | Bickel et al. | 73/67.2 |

*Primary Examiner*—William A. Powell
*Assistant Examiner*—Jerome W. Massie
*Attorney, Agent, or Firm*—Frank R. Trifari; Bernard Franzblau

[57] ABSTRACT

Apparatus for non-destructively monitoring the bonding quality of an ultrasonic bonding system by detecting the amplitude deviation of a vibrating bonding tool between the vibration amplitude thereof in the freely vibrating (no-load) condition and the vibration amplitude during an ultrasonic bonding operation.

22 Claims, 4 Drawing Figures

ULTRASONIC BONDING APPARATUS

This invention relates to ultrasonic bonding apparatus, particularly but not exclusively to ultrasonic wire bonding apparatus, and to an instrument for use with an ultrasonic bonding apparatus.

In the manufacture of certain electronic components, for example semiconductor devices such as transistors and integrated circuits, it is necessary to form electrical connections to very small bodies by bonding fine gauge wires at certain predetermined locations on the body for establishing the connections. Various techniques have been established for this wire bonding. Operator controlled machines based on these techniques are commercially available. Such machines can be used for bonding the end of a wire at a predetermined location on a first body, for example, a connection pad forming part of the metal interconnection pattern at the surface of an integrated circuit chip, lead a length of the wire from the bond thus made at the first body to a second body, bond the wire to the second body, for example at the end of a metal conductor forming part of an envelope for an integrated circuit chip, and then sever the wire after the bond has been made to the second body. The bodies are positioned under a microscope and the machine operator adjusts the relative position of the work and a bonding tool of the machine in accordance with his or her visual observations using the microscope, the relative motion being achieved using a motion dividing pantograph. The bonding is commonly effected by one of two methods, these being thermo-compression bonding and ultrasonic bonding. In thermo-compression bonding the tip of the bonding tool is electrically heated while the wire end is applied under pressure to the portion of the body to which electrical connection is to be made. In ultrasonic bonding the bonding tool is caused to vibrate at ultrasonic frequency while the wire end is applied under pressure to the portion of the body to which electrical connection is to be made. Commonly in both methods the wire is present in and fed through a capillary tool. For making the bond between the wire end and the first body, prior to the bonding a local melting of the end of the wire is effected to form a ball end which is subsequently bonded to the body. For making the bond between that part of the wire linking the first bond and the second body a so-called 'wedge' bond is made by the tip of the bonding tool acting as a form of wedge under which the wire is pressed with the wire projecting on opposite sides of the tip.

In the semiconductor device industry the ultrasonic bonding process is well established, particularly for the bonding of gold wires to aluminium metallisation patterns. The main advantages of using ultrasonic bonding rather than thermocompression bonding result from the fact that the former is not a thermal process, and while a local temperature rise is known to result from the combined effects of elastic hysteresis, friction, plastic deformation and other factors, there is strong evidence to suggest that the temperature rise does not exceed 100° C. As a result many undesirable effects, which can occur when using thermocompression bonding under such conditions whereby intermetallic compounds can be produced, can be eliminated. Furthermore with the ultrasonic bonding method the time required to form a bond is relatively short. However the adoption of ultrasonic bonding as a standard process has also been accompanied by certain problems. In particular it has been found that the bond quality can vary appreciably across even a single device chip even where bonding machine settings are nominally identical. One very important factor involved in the bond quality is the bond strength. In some cases low strength bonds can be identified visually and can be attributed to geometrical, metallisation or oxide step effects on the semiconductor device chip. However in most cases no estimation of the strength of the bond can be made without destructively shear testing the bond. Furthermore as little is currently known of the mechanisms which directly effect the properties of ultrasonic bonds, the procedures used for adjusting and maintaining production machines in service are diverse. At the present time there are no commercially available ultrasonic wire bonding apparatus having provision for monitoring the bond strength.

The general procedure for testing wire bonds is one of pull testing, in which the wire loop between the bonds on the first and second bodies, for example a device chip and an envelope conductor, is pulled in tension and the force required to cause failure is measured. It will be appreciated that this destructive method of testing bond strength is time consuming and expensive.

According to a first aspect of the invention there is provided an ultrasonic bonding apparatus comprising: a bonding tool for securing a first body to a second body when said first body is held against the second body by the bonding tool and the tool is caused to vibrate at ultrasonic frequency, primary transducer means coupled to the bonding tool for converting input electrical signals into mechanical vibrations at ultrasonic frequency, secondary transducer means for producing electrical signals indicative of the amplitude of the vibrations of the tool generated by the primary transducer means, signal sampling means, for sampling signals derived from the secondary transducer means when, with a certain power input to the primary transducer means, the bonding tool is in a freely vibrating condition, and for sampling signals derived from the secondary transducer means when, with the same power input to the primary transducer means a bonding operation is in progress, signal comparison means for comparing the signals sampled in the freely vibrating condition of the bonding tool with the signals sampled when said bonding operation is in progress, and indicator means associated with the signal comparison means for providing an indication of a bond of unacceptable quality when a predetermined minimum amplitude deviation between the freely vibrating condition and the bonding operation is not established.

According to a second aspect of the invention there is provided an ultrasonic wire bonding apparatus comprising a bonding tool for securing a wire to a body when held against the body by the bonding tool and the tool is caused to vibrate at ultrasonic frequency, primary transducer means coupled to the bonding tool for converting electrical input signals into mechanical vibrations at ultrasonic frequency, secondary transducer means for producing electrical signals indicative of the amplitude of the vibrations of the tool generated by the primary transducer means, signal sampling means for sampling signals derived from the secondary transducer means when, with a certain power input to the primary transducer means, the bonding tool is in a freely vibrating condition, and for sampling signals derived from the secondary transducer means when, with the same power input to the primary transducer means, a wire bonding operation is in progress, signal comparison means for comparing the signals sampled in the freely vibrating condition of the bonding tool with the signals sampled when said bonding operation is in progress, and indicator means associated with the signal comparison means for providing an indication of a bond of unacceptable quality when a predetermined minimum amplitude deviation between the freely vibrating condition and the bonding operation is not established.

It has been found as a result of extensive investigations into the mechanisms involved in the ultrasonic bonding of gold wires to aluminium metallisation on transistor and integrated circuit chips, that the shear strength of the bond is related to the change in the amplitude of the bonding tool vibrations that occurs when bonding. The greater is the amplitude deviation from the freely vibrating condition the stronger is the bond. Furthermore it has been found that this relationship applies irrespective of the outline of the weld pulse envelope obtained when applying the bonding pulse. It is postulated that when the amplitude deviation is higher then more energy is being dissipated in effecting the bond. The extent to which a bond occurs influences the loading on the tip of the bonding head. This effectively changes the mechanical resonant length of the capillary through which the wire is fed and modifies the amplitude in accordance with the standing wave pattern for different capillary lengths. It is found that the relationship between amplitude deviation and bond strength applies irrespective of whether the amplitude decreases or increases during the bonding operation in comparison to that in the freely vibrating condition. The amplitude may decrease or increase depending upon the particular resonance characteristics produced which depend, inter alia, on the nature of the bonding tool employed, including the length of its projection.

In a preferred form of the ultrasonic wire bonding apparatus in accordance with the invention, variable delay trigger circuit means are present for activating the signal sampling means in a bonding operation at a predetermined time following the commencement of said bonding operation. It has been found that the time at which, during the bonding pulse, the amplitude measurement is made is important and this is determined by the shape of the weld pulse envelope. Thus when applying the bonding pulse a finite time elapses before the amplitude of the bonding tool reaches a steady state. This rise time is determined by many factors, including the diameter of the wire, the magnitude of the freely vibrating amplitude, and the size of the ball at the end of the wire when using the previously described nail-head bonding. Typically the sampling may be effected for a period of one millisecond and at a time lying between 25% and 50% of the duration of the weld pulse. In a typical case of ultrasonic bonding of gold wire of 25 microns diameter to an aluminium metal layer portion on a semiconductor chip, when using a bonding pulse of 60 milliseconds duration, the rise time may be up to 10 milliseconds and the variable delay trigger circuit means may be set so that sampling of the signals derived from the secondary transducer means does not begin until 20 milliseconds after the commencement of the bonding pulse. The Applicants have found no direct correlation between the shape of the weld pulse envelope and the quality of the resultant bond. Furthermore it was found that for higher values of the amplitude in the freely vibrating condition, as determined by the power input to the primary transducer means, the rise time to reach a steady state during the bonding pulse increases. Thus for any particular range of wire materials and primary transducer input power settings, it is necessary first to evaluate the weld pulse envelope characteristics before predetermining the time during the bonding pulse at which the sampling of the signals derived from the secondary transducer means is commenced.

In one form of an ultrasonic wire bonding apparatus in accordance with the invention the primary transducer means comprise a magnetostrictive transducer which is connected to an amplifying horn adjacent the end to which there is secured the bonding tool. Although the scope of the present invention also contemplates the use of a piezoelectric transducer for the primary transducer means, the presence of a magnetostrictive primary transducer is found to be particularly advantageous because the provision of the secondary transducer in a simple manner is readily facilitated. Thus, in a preferred form, when using a magnetostrictive primary transducer, the secondary transducer means comprise a piezoelectric transducer attached to the primary magnetostrictive transducer. The Applicants have found that when using such an arrangement the electrical signals derived from the secondary transducer are directly proportional to the vibrational amplitude of the tool tip of the capillary head. It is to be noted however that within the scope of the invention there is also included the use of a secondary transducer which is situated elsewhere in the system, for example attached to a part of a bonding head on which the tool is mounted.

When using the preferred arrangement of a piezoelectric secondary transducer mounted on a magnetostrictive primary transducer, the mounting may be chosen such that the secondary transducer is situated at the position where a nodal or anti-nodal point occurs on the primary transducer. However it is preferable to mount the secondary transducer at the nodal point because this corresponds to a position of maximum stress and minimum strain. Mounting the secondary transducer at an anti-nodal point, that is at a position of maximum strain and minimum stress, has the relative disadvantage that a larger vibrational amplitude exists at this point and problems can arise in connection with the possible detachment of the leads to the secondary transducer due to the fatigue stressing of the leads and/or the connections of the leads to the transducer.

Embodiments of the various aspects of the invention will now be described, by way of example, with reference to the accompanying diagrammatic drawings, in which.

Figure 1:
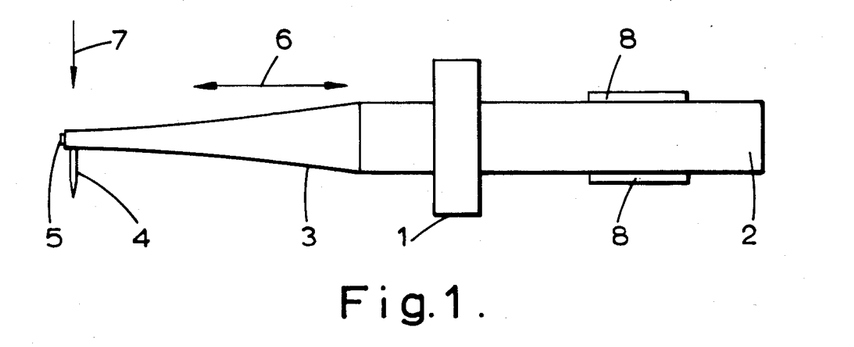
FIG. 1 is a schematic representation of part of an ultrasonic wire bonding apparatus in accordance with the second aspect of the invention.

Referring now to FIG. 1, there is shown part of an ultrasonic bonding apparatus. The apparatus comprises a mounting flange 1 for a primary magnetostrictive transducer 2 which is employed for producing vibrations at ultrasonic frequency. At the end of an amplifying horn 3 remote from the primary transducer 2, a bonding tool in the form of a capillary 4 is secured by a clamping screw 5. The tool is caused to vibrate along a substantially horizontal axis indicated by the arrow 6 and under a load indicated by the arrow 7. Attached to the primary transducer is a secondary transducer 8 for producing electrical signals representative of the mechanical oscillations of the bonding tool. In the present example the secondary transducer 8 is a piezoelectric transducer.

The capillary 4 is made of tungsten carbide and in the example of a bonding operation to be described hereinafter, the length of its projection below the amplifying horn 3 is chosen such that the resonant frequency of the system provides for a decrease in the vibrational amplitude under load conditions as compared with the freely vibrating condition. The mounting of the secondary transducer 8 on the primary transducer 2 is chosen such that it is situated at a nodal point.

Figure 2:
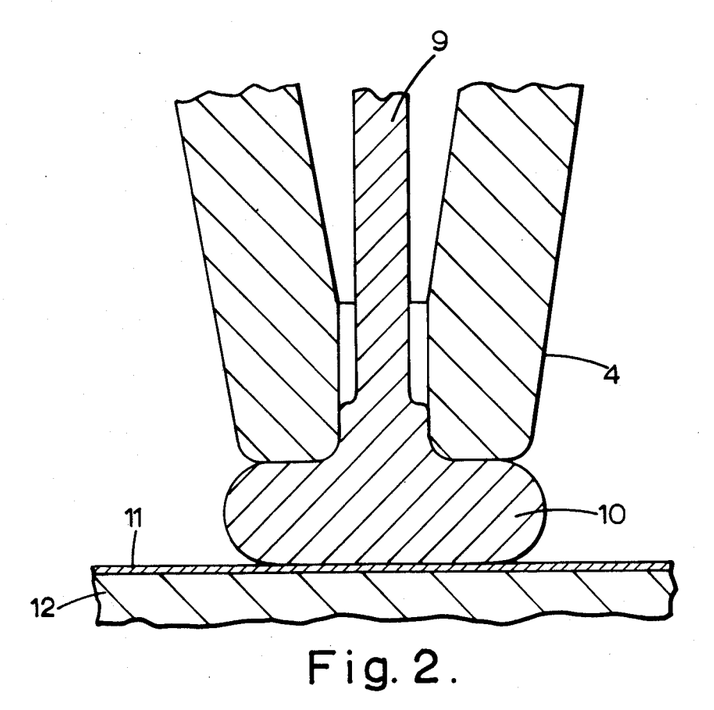
FIG. 2 shows in cross-section part of the bonding tool present in the aparatus shown in FIG. 1 during the, operation of bonding a wire to a semiconductor body.

FIG. 2 shows in a detailed cross-section the capillary end 4 of the bonding head through which a gold wire 9 extends. The end of wire 9 has been subjected to a local melting to form a ball which deforms during the bonding operation to form a portion 10 generally referred to as a 'nailhead'. The Figure shows the capillary end 4 forcing the 'nailhead' 10 against an aluminium contact pad 11 on a part of the surface of a silicon chip 12.

Figure 3:
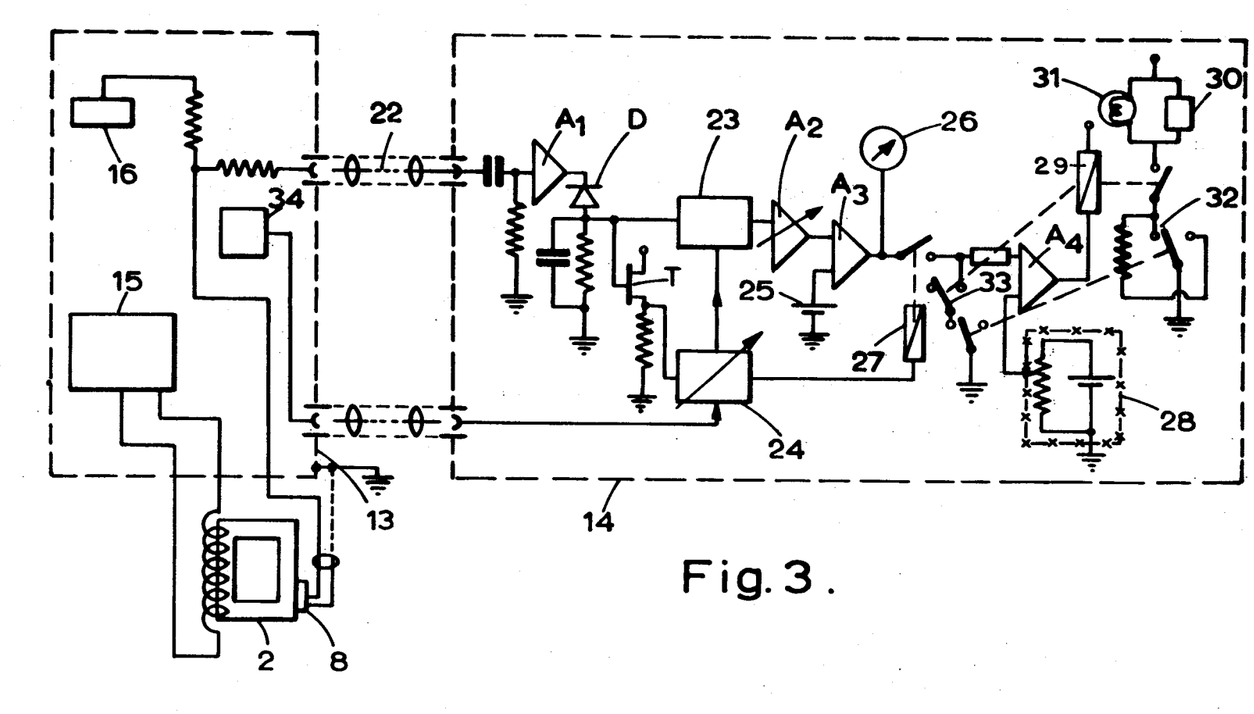
FIG. 3 is an electrical circuit diagram partly in block diagram form of an ultrasonic wire bonding apparatus in accordance with the second aspect of the invention and including an instrument in accordance with the third aspect of the invention.

Referring now to FIG. 3, there is shown, partly in block form, the circuit diagram of an ultrasonic bonding apparatus in accordance with the invention including an ultrasonic generator set 13 and a detachable instrument 14. The detachable instrument may be referred to as an amplitude deviation detector and is indicated within the broken line 14.

The ultrasonic generator set comprises an ultrasonic generator power amplifier 15 of which the output is fed to the magnetostrictive transducer 2.

The secondary transducer 8 provides a 60 KHz output signal the amplitude of which is dependant upon the power output setting of the generator and the loading at the tip of the bonding tool. The output of the secondary transducer is fed within the generator set 13 to output level monitoring circuit means 16 and to provide a meter indication of the power setting.

The signal output from the secondary transducer 8 is coupled into the amplitude deviation detector via a co-axial link 22 together with a 20:1 attenuator. This attenuator is provided to minimise the loading on the secondary transducer, the output of which would otherwise be modified. The 60 KHz signal thus received by the amplitude deviation detector is then amplified using an A.C. coupled amplifier stage $A_1$ having its gain pre-set in the region between 10 and 20. The output of $A_1$ is fed to a diode D and the rectified signal is then fed to a sample and hold circuit module 23. The rectified signal is also fed to the gate of a field effect transistor T so that when this signal exceeds a certain value, the transistor is made conductive and is effective in activating a sample delay trigger circuit 24. Activation of the circuit 24 causes the module 23, after a preselected delay time, for example of between 10 milliseconds and 100 milliseconds, to sample the signal at its input, this sampling being for a period, for example, of one millisecond. The output of the sample and hold circuit module 23 is fed to two further stages $A_2$ and $A_3$ of which the stage $A_2$ is an amplifier whose gain can be varied and the stage $A_3$ serves as a comparator for comparing the output of stage $A_2$ with a reference voltage source 25. A moving coil voltmeter 26 is connected to the output side of the amplifier stage $A_3$ and is used for indicating the amplitude deviation from a pre-set value as a percentage change.

A second output line from the sample delay trigger circuit 24 energises, for example for a period of 80 milliseconds, a relay 27 which controls the connection between the output side of the comparator stage $A_3$ and a first input of a comparator amplifier stage $A_4$, the second input to the comparator amplifier stage $A_4$ being connected to an adjustable D.C. source 28. The output of the comparator amplifier stage $A_4$ is connected to a relay 29 which when energised is effective in closing the circuit connection of an audible alarm 30 and a warning light 31. A control switch 32 is included for setting up purposes or for pre-activating this circuit into an 'armed' condition ready to be triggered when the relay 29 is energised by an output signal of predetermined magnitude from the comparator amplifier stage $A_4$.

The operation of the bonding apparatus is as follows: With the bonding head in the freely vibrating condition the gain of the amplifier stage $A_2$ is manually adjusted until zero deflection is indicated on the amplitude percentage deviation meter. During bonding the percentage change in the amplitude of the vibrations of the tool head is indicated by the meter. To pre-set the percentage deviation level below which the alarm circuits will operate the control switch 32 is placed in a 'set up' position corresponding to the open circuit condition in FIG. 3. This inhibits the audible alarm device 30 and removes the alarm operation latching circuit provided by the relay controlled switch 33. A freely vibrating amplitude signal is then sampled and the gain of $A_2$ is adjusted, while receiving the output of the module 23 corresponding to this signal, to give an indication on the meter 26 of the desired predetermined minimum percentage amplitude deviation. The D.C. level of the second input to the comparator amplifier stage $A_4$ is then manually adjusted until the indicator light 31 just fails to be activated when sampling signals of equal amplitude to that of the initial signal sampled in the freely vibrating condition. The gain of $A_2$ is then readjusted so that the meter 26 indicates a zero deviation for the stored amplitude level required. The control switch is then moved into the closed circuit condition to 'arm' the alarm circuit 30, 31. The sample delay circuit 24 is adjusted to a desired value, for example one quarter of the duration of the bonding pulse. With the instrument now activated and the warning circuit 30, 31 in the 'armed' condition, during subsequent bonding cycles when a bond is being made at the same selected setting of the power input to the primary transducer the loading on the bonding head changes the vibration amplitude and therefore the output of the secondary transducer. The sampled signal level from $A_3$ is compared in the comparator amplifier stage $A_4$ with the previously set up level corresponding to the predetermined minimum permissible percentage deviation. If this predetermined minimum amplitude deviation is exceeded the output of $A_4$ is ineffective in activating the warning circuit 30, 31 via the relay 29 and the bonding cycle is continued. However if the predetermined minimum amplitude deviation is not exceeded then the output of $A_4$ is effective in activating the warning circuit 30, 31 via the relay 29 and appropriate measures may be taken by the operator. The apparatus may include means for interrupting the bonding operation when the alarm circuit 30, 31 is activated upon the amplitude deviation failing to reach the minimum predetermined deviation.

For the previously described method of bonding wires to semiconductor devices in which a ball form a bond, a so-called 'nailhead bond', is made between the wire end and the chip and a wedge form of bond is thereafter made to the envelope lead-in conductor, a control input 34 from the generator set is used to inhibit the operation of the sampling circuits of the detector instrument during the wedge-bonding, it being noted that the critical bond strength which is involved is that in the 'nailhead' bond.

Figure 4:
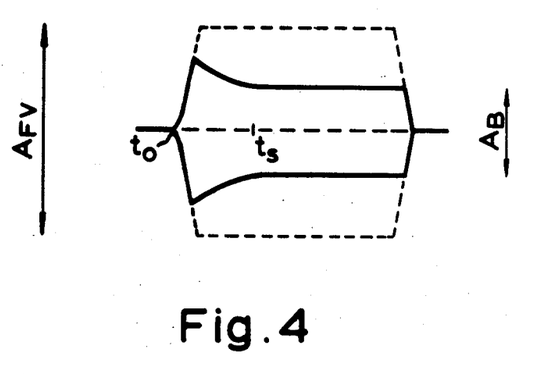
FIG. 4 is a diagrammatic representation of the weld pulse envelope produced when ultrasonically bonding a gold wire to an aluminium metal layer part.

FIG. 4 shows a typical weld pulse envelope when ultrasonically bonding a gold wire of 25 microns diameter to an aluminium metal layer part with an apparatus as described with reference to FIGS. 1 to 3.

The capillary tool is made of tungsten carbide and the length of its projection below the mounting at the end of the amplifying horn is 6mm. The weld pulse envelope during a bonding operation is shown in the full line, the pulse having a total duration of 65 milliseconds. It is seen that there is a rise time of several milliseconds when the ampllitude increases to a peak and then decreases before reaching a steady state amplitude $A_B$ (when bonding). It is this amplitude $A_B$ which is sampled and in the present example the time $t_s$ at which the sampling of the signal from the secondary transducer means is arranged to occur is 20 milliseconds after the commencement $t_o$ of the weld pulse. As already mentioned for different bonding conditions there occurs a wide difference in the shape of the weld pulse envelopes and the sampling delay period $t_o$ to $t_s$ is chosen accordingly. In FIG. 4 there is also shown in broken lines the weld pulse envelope of the capillary tool in the freely vibrating condition with the same power input to the primary transducer, the steady state amplitude in the freely vibrating condition being $A_{FV}$. The amplitude deviation detector instrument shown in FIG. 3 thus is effective in giving an indication of the amplitude deviation $A_{FV} - A_B$ and is effective to provide an audible and visual alarm when such amplitude deviation fails to exceed a certain minimum pre-set value. For a fixed value of $A_{FV}$ then the deviation expressed as a percentage of the amplitude in the freely vibrating condition, that is $(A_{FV} - A_B)/A_{FV}$ expressed as a percentage, is found to be directly proportional to the bond shear strength and thus for such a higher fixed value of $A_{FV}$ there exists a minimum percentage deviation for production of a bond of acceptable quality. With higher values of $A_{FV}$ produced by higher power input to the primary transducer means, the value of $A_B$ increases but to a smaller proportional extent and the acceptable minimum percentage value of the deviation to obtain a minimum bond strength of the same value in the same materials is lower for such a higher value of $A_{FV}$.

It will be appreciated that the apparatus and instrument in accordance with the invention may be suitably modified for use in a similar operation for monitoring the bond strength during a wedge-bonding operation. It will also be understood that the apparatus and instrument may be used in other ultrasonic bonding operations for monitoring the bond strength, for example when bonding wires of material other than gold and of different diameters and when bonding to materials other than aluminium. Furthermore an apparatus in accordance with the first aspect of the invention may be employed in other ultrasonic bonding processes, for example in ribbon wire bonding or other metal welding operations.

In the example described the material of the tool and the length of the bonding tool projecting below the amplifying horn are chosen such that the resonant frequency of the system provides for a decrease in vibrational amplitude under load conditions as compared with the freely vibrating condition and the instrument is set-up to respond to such a decrease in the vibrational amplitude. However the apparatus may be suitably modified to respond to an increase in the vibrational amplitude in the case where the resonant frequency of the system provides for an increase in the vibrational amplitude under load conditions as compared with the freely vibrating condition.

What we claim is:

1. An ultrasonic bonding apparatus comprising, a bonding tool for securing a first body to a second body, primary electromechanical transducer means coupled to the bonding tool for converting input electrical signals into mechanical vibrations of the bonding tool at ultrasonic frequency, secondary electromechanical transducer means coupled to the apparatus for producing electrical signals indicative of the amplitude of the vibrations of the bonding tool generated by the primary transducer means, signal sampling means for sampling signals derived from the secondary transducer means at a certain power input to the primary transducer means and with the bonding tool in a freely vibrating condition and for sampling signals derived from the secondary transducer means at the same power input to the primary transducer means and with a bonding operation in progress, signal comparison means coupled to said sampling means for comparing the signals sampled in the freely vibrating condition of the bonding tool with the signals sampled when said bonding operation is in progress, and indicator means controlled by the signal comparison means for indicating a bond of unacceptable quality in the event a predetermined minimum amplitude deviation between the freely vibrating condition and the bonding operation is not established.

2. An ultrasonic wire bonding apparatus comprising, a bonding tool for securing a wire to a body, primary transducer means coupled to the bonding tool for converting electrical input signals into mechanical vibrations of the bonding tool at ultrasonic frequency, secondary transducer means for producing electrical signals indicative of the amplitude of the vibrations of the bonding tool, signal sampling means for sampling signals derived from the secondary transducer means at a certain power input to the primary transducer means and with the bonding tool in a freely vibrating condition and for sampling signals derived from the secondary transducer means with the same power input to the primary transducer means and with a wire bonding operation in progress, signal comparison means for comparing the signals sampled in the freely vibrating condition of the bonding tool with the signals sampled when said bonding operation is in progress, and indicator means associated with the signal comparison means for indicating a bond of unacceptable quality corresponding to a predetermined minimum amplitude deviation between the freely vibrating condition and the vibration during a bonding operation.

3. An ultrasonic wire bonding apparatus as claimed in claim 2 further comprising variable delay trigger circuit means responsive to the signals derived from said secondary transducer means for activating the signal sampling means during a bonding operation and with a predetermined time delay following commencement of said bonding operation.

4. An ultrasonic wire bonding apparatus as claimed in claim 2 wherein said signal comparison means comprise a comparator amplifier having a first input for signals derived from the signal sampling means and a second input for a reference signal which is determined by said minimum amplitude deviation, said comparator amplifier having an output for deriving an indication signal that includes the fundamental vibration frequency of the bonding tool.

5. An ultrasonic bonding apparatus as claimed in claim 4 further comprising a meter coupled to the output of the comparator amplifier for indicating the signal level at the first input to the comparator amplifier.

6. An ultrasonic bonding apparatus as claimed in claim 4 further comprising variable gain amplifier means connected between the signal sampling means and the first input to the comparator amplifier for presetting the level of the second input to the comparator amplifier by adjustment of the amplification provided by said variable gain amplifier means when sampling signals in the freely vibrating condition of the bonding tool.

7. An ultrasonic wire bonding apparatus as claimed in claim 2 wherein the primary transducer means comprise a magnetostrictive transducer mechanically coupled to an amplifying horn adjacent the free end of which horn there is secured the bonding tool.

8. An ultrasonic wire bonding apparatus as claimed in claim 7, wherein the secondary transducer means comprise a piezoelectric transducer attached to the primary magnetostrictive transducer.

9. An ultrasonic wire bonding apparatus as claimed in claim 8, wherein the secondary transducer is mounted at a position where a vibration nodal point occurs on the primary transducer.

10. An ultrasonic wire bonding apparatus as claimed in claim 2 wherein the bonding tool comprises a capillary member, and the material of the capillary and the length of the free end of the capillary member below its mounting are chosen to produce a resonance characteristic whereby the amplitude of the ultrasonic vibrations when the bonding capillary is under load is less than the amplitude of the ultrasonic vibrations when the bonding capillary is in the freely vibrating condition, the signal comparison means and associated indicator means being responsive to such a decrease in the amplitude of the vibrations.

11. An instrument for monitoring an ultrasonic bonding apparatus of the type including a vibratory bonding tool, a primary transducer for vibrating the bonding tool, and a secondary transducer which produces electric signals determined by the vibration amplitude of the bonding tool, comprising means for converting the electrical signals derived from the secondary transducer into D.C. signals proportional to the amplitude of the vibrations of the bonding tool, signal sampling means for sampling the D.C. signals obtained at a certain power input to the primary transducer and with the bonding tool in a freely vibrating condition and for sampling the D.C. signals obtained with the same power input to said primary transducer and with a bonding operation in progress, and signal comparison means coupled to said sampling means for comparing the signals sampled in the freely vibrating condition of the bonding tool with the signals sampled when said bonding operation is in progress for deriving a control signal determined by the amplitude deviation between the vibration amplitude of the bonding tool in the freely vibrating condition and the vibration amplitude during a bonding operation and which control signal is indicative of the bond quality.

12. An instrument as claimed in claim 11 further comprising variable delay trigger circuit means responsive to said secondary transducer electric signals for activating the signal sampling means during a bonding operation and at a predetermined time following commencement of said bonding operation.

13. An instrument as claimed in claim 12 wherein said signal comparison means includes a first input coupled to receive D.C. signals derived from the signal sampling means and a second input for receiving a reference D.C. voltage which is pre-set in accordance with a predetermined minimum vibration amplitude deviation indicative of a bond of unacceptable quality.

14. An instrument as claimed in claim 11 wherein said signal comparison means comprise a comparator amplifier having a first input for D.C. signals derived from the signal sampling means and a second input for a reference D.C. signal which is pre-set in accordance with a predetermined minimum amplitude deviation indicative of a bond of unacceptable quality.

15. An instrument as claimed in claim 14 further comprising a meter coupled to the output of the comparator amplifier for indicating the signal level at the first input to the comparator amplifier.

16. An instrument as claimed in claim 14 further comprising variable gain amplifier means connected between the signal sampling means and the first input to the comparator amplifier so as to preset the D.C. level of the second input to the comparator amplifier by adjustment of the amplification provided by said variable gain amplifier means when sampling signals in the freely vibrating condition of the bonding tool.

17. Apparatus for monitoring an ultrasonic welding system of the type including a vibratory bonding tool, a first transducer for vibrating the bonding tool and a second transducer for generating electric signals determined by the amplitude of vibration of the bonding tool, said aparatus comprising an input terminal for receiving said electric signals, means coupled to said input terminal for sampling, in mutually exclusive time intervals, the electric signals derived from the second transducer with the bonding tool freely vibrating and with the bonding tool under load in a bonding operation, and signal comparison means coupled to the output of the sampling means for effectively comparing the electric signals sampled in the freely vibrating condition of the bonding tool with the electric signals sampled during said bonding operation thereby to derive a control signal determined by the deviation in the amplitude of vibration of the bonding tool between the freely vibrating condition and the load condition.

18. Apparatus as claimed in claim 17 further comprising variable delay means coupled to the sampling means for activating the sampling means during a bonding operation with a given delay after the start of a bonding operation such that the vibrational amplitude of the bonding tool has stabilized to a steady state value.

19. Apparatus as claimed in claim 18, wherein said variable delay means includes means for generating a short duration activating pulse for the sampling means so that the sampling period is a small fraction of the bonding operation period.

20. Apparatus as claimed in claim 17 wherein the signal comparison means includes a first input coupled to the output of the sampling means and a second input coupled to a source of reference voltage that represents the minimum acceptable amplitude deviation required to produce a bond of acceptable quality.

21. Apparatus as claimed in claim 17 further comprising means for activating the sampling means with a given time delay after the start of a bonding operation and for a time period during said bonding operation that is a small fraction of the period thereof.

22. Apparatus as claimed in claim 21 wherein said activating means is arranged to activate the sampling means with a time delay between 25% and 50% of the bonding operation time period.

* * * * *

UNITED STATES PATENT OFFICE
CERTIFICATE OF CORRECTION

Patent No. 4,040,885                    Dated August 9, 1977

Inventor(s) MICHAEL JOHN HIGHT ET AL

It is certified that error appears in the above-identified patent and that said Letters Patent are hereby corrected as shown below:

IN THE CLAIMS

Claim 2, line 21, "predetermined minimum amplitude deviation"

should read --predetermined amplitude déviation--;

Claim 4, line 6, "minimum" should read --predetermined--;

Claim 10, line 3, after "capillary" it should read --member--;

line 7, after "capillary" it should read --member--;

line 9, after "capillary" it should read --member--.

Signed and Sealed this

Nineteenth Day of September 1978

[SEAL]

Attest:

RUTH C. MASON
*Attesting Officer*

DONALD W. BANNER
*Commissioner of Patents and Trademarks*